United States Patent
Pang et al.

(10) Patent No.: US 9,276,373 B1
(45) Date of Patent: Mar. 1, 2016

(54) FREQUENCY STABILIZED COHERENT BRILLOUIN RANDOM FIBER LASER

(71) Applicant: University of Ottawa, Ottawa (CA)

(72) Inventors: Meng Pang, Ottawa (CA); Xiaoyi Bao, Ottawa (CA); Liang Chen, Ottawa (CA); Zengguang Qin, Ottawa (CA); Yang Lu, Ottawa (CA); Ping Lu, Ottawa (CA)

(73) Assignee: University of Ottawa, Ottawa, Ontario (CA)

( * ) Notice: Subject to any disclaimer, the term of this patent is extended or adjusted under 35 U.S.C. 154(b) by 31 days.

(21) Appl. No.: 14/488,399

(22) Filed: Sep. 17, 2014

Related U.S. Application Data

(60) Provisional application No. 61/880,646, filed on Sep. 20, 2013.

(51) Int. Cl.
*H01S 3/30* (2006.01)
*H01S 3/13* (2006.01)

(52) U.S. Cl.
CPC *H01S 3/13* (2013.01); *H01S 3/1301* (2013.01)

(58) Field of Classification Search
CPC ..... H01S 3/13; H01S 3/1301; H01S 3/10007; H01S 3/10; H01S 3/1305; H01S 3/302
USPC .......................................... 359/334
See application file for complete search history.

(56) References Cited

U.S. PATENT DOCUMENTS

| 6,374,006 B1* | 4/2002 | Islam | H01S 3/302 359/334 |
|---|---|---|---|
| 2003/0058899 A1* | 3/2003 | Islam | H01S 5/4025 372/6 |
| 2013/0083813 A1* | 4/2013 | Hartog | G01D 5/35335 372/6 |

OTHER PUBLICATIONS

R. V. Ambartsumyan, N.G. Basov, P. G. Kryukov, and V. S. Letokhov, "A laser with a nonresonant feedback," IEEE J. Quantum Electron. 2, 442-446 (1966).
V. S. Letokhov, "Stimulated emission of an ensemble of scattering particle with negative absorption," JETP Lett. 5, 212-215 (1967).
H. Cao, "Random lasers: development, features and applications," Opt. Photon. News 16, 24-29 (2005).
H. Cao, "Lasing in random media," Wave in Random Media, 13, R1-R39 (2003).
H. Cao, "Review on latest development in random lasers with coherent feedback," J. Phys. Math. Gen. 38, 10497-10535 (2005).
R. C. Polson, M. E. Raikh, and Z. V. Vardeny, "Universal properties of random lasers," IEEE J. Sel. Top. Quantum Electron. 9(1), 120-123 (2003).
S. Gottardo, O. Cavalieri, O. Yaroshchuk, and D. S. Wiersma, "Quasi-two-diffusive random laser action," Phys. Rev. Lett. 93, 263901 (2004).
N. M. Lawandy, R. M. Balachandran, A. S. L. Gomes, and E. Sauvain, "Laser action in strongly scattering media," Nature 368, 436-438 (1994).
H. Cao, Y. G. Zhao, S. T. Ho, E. W. Seelig, Q. H. Wang, and R. P. H. Chang, "Random laser action in semiconductor powder," Phys. Rev. Lett. 82, 2278-2281 (1999).

(Continued)

*Primary Examiner* — Mark Hellner
(74) *Attorney, Agent, or Firm* — Alchemy-Partners, PC

(57) ABSTRACT

A high-finesse Fabry-Perot interferometer (FPI) is introduced into a coherent Brillouin RFL configuration to thereby produce a frequency stabilized random laser.

6 Claims, 12 Drawing Sheets

(56) References Cited

OTHER PUBLICATIONS

G. R. Williams, S. B. Bayram, S. C. Rand, T. Hinklin, and R. M. Laine, "Laser action in strongly scattering rare-earth-metal-doped dielectric nanophosphors," Phys. Rev. A 65, 013807 (2002).

X. Meng, K. Fujita, Y. Zong, S. Murai, and K. Tanaka, "Random lasers with coherent feedback from high transparent polymer films embedded with silver nanoparticles," Appl. Phys. Lett. 92(20), 201112 (2008).

R. C. Polson, and Z. V. Vardeny, "Random lasing in human tissues," Appl. Phys. Lett. 85, 1289-1291 (2004).

C. J. S .Matos, L. S. Meneze, A. M. Brito-Silva, M. A. M. Gamez, A. S. L. Gomes, and C. B. Araujo,"Random fiber laser," Phys. Rev. Lett. 99, 153903 (2007).

S. K. Turitsyn, S. A. Babin, A. E. El-Taher, P. Harper, D. V. Churkin, S. I. Kablukov, J. D. Ania Castanon, V. Karalekas, and E. V. Podivilov, "Random distributed feedback fibre laser," Nat. Photonics 4, 231-235 (2010).

A. A. Fotiadi, "An incoherent fibre laser," Nat. Photonics 4, 204-205 (2010).

M. Gagne, and R. Kashyap, "Demonstration of a 3 mW threshold Er-doped random fiber laser based on a unique fiber Bragg grating," Opt. Express, 17(21), 19067-19074 (2009).

N. P. Puente, E. I. Chaikina, T. A. Leskova, and E. R. Mendez, "Single-mode Er-doped fiber random laser with distributed Bragg grating feedback," Opt. Express 17(2), 395-404 (2009).

Z. Hu, Q. Zhang, B. Miao, Q. Fu, G. Zou, Y. Chen, Y. Luo, D. Zhang, P. Wang, H. Ming, and Q. Zhang, "Coherent random fiber laser based on nanoparticles scattering in the extremely weakly scattering regime," Phys. Rev. Lett. 109 (25), 253901 (2012).

M. Pang, S. Xie, X. Bao, Da-Peng Zhou, Y. Lu, and L. Chen, "Rayleigh scattering-assisted narrow linewidth Brillouin lasing in cascaded fiber," Opt. Lett. 37(15), 3129-3131 (2012).

M. Pang, X. Bao, and L. Chen, "Observation of narrow linewidth spikes in the coherent Brillouin random fiber laser," Opt. Lett. 38(11), 1866-1868 (2013).

R. W. Boyd, and K. Rzazewski, "Noise initiation of stimulated Brillouin scattering," Phys. Rev. A 42, 5514-5521 (1990).

R. W. Boyd, Nonlinear Optics, (Academic Press, San Diego, 2010).

A. Yeniay, J. M. Delavaux, and J. Toulouse, "Spontaneous and stimulated Brillouin scattering gain spectra in optical fibers," IEEE J. Lightwave Technol. 20, 1425-1432 (2002).

A. H. Hartog, and M. P. Gold, "On the theory of backscattering in single-mode optical fibers," IEEE J. Lightwave Technol. 2, 76-82 (1984).

S. Xie, M. Pang, X. Bao, and L. Chen, "Polarization dependence of Brillouin linewidth and peak frequency due to fiber inhomogeneity in single mode fiber and its impact on distributed fiber Brillouin sensing," Opt. Express, 20(6), 6385-6399 (2012).

G. A. Ball, and W. W. Morey, "Continuously tunable single-mode erbium fiber laser," Opt. Lett. 17(6), 420-422 (1992).

M. Li, S. Li, and D. A. Nolan, "Nonlinear Fibers for signal processing using optical Kerr effects," IEEE J. Lightwave Technol. 23(11), 3606-3614 (2005).

T. Kessler, C. Hagemann, C. Grebing, T. Legero, U. Sterr, F. Riehle, M. J. Martin, L. Chen and J. Ye, "A 0-mHz-linewidth laser based on a silicon single-crystal optical cavity," Nat. Photonics 6, 687-692 (2012).

C. Spiegelberg, J. Geng, Y. Hu, Y. Kaneda, S. Jiang, and N. Peyghambarian,"Low-noise narrow-linewidth fiber laser at 1550 nm (Jun. 2003)," IEEE J. Lightwave Technol. 22(1), 57-64 (2004).

G. A. Cranch, and G. A. Miller, "Fundamental frequency noise properties of extended cavity erbium fiber lasers," Opt. Lett. 36(6), 906-908 (2011).

S. Foster, A. Tikhomirov, and M. Milnes, "Fundamental thermal noise in distributed feedback fiber lasers," IEEE J. Quantum Electron. 5, 378-384 (2007).

S. Foster, G. A. Cranch and A. Tikhomirov, "Experimental evidence for the thermal origin of 1/f frequency noise in erbium-doped fiber lasers," Phys. Rev. A 79, 053802 (2009).

D. W. Allan, "Time and frequency (time-domain) characterization, estimation and prediction of precision clocks and oscillators," IEEE Trans. Ultr. Ferr. Contr. 34, 647-654 (1987).

Notification of Transmittal of the International Search Report and the Written Opinion of the International Searching Authority, or the Declaration received in PCT Application No. PCT/IB2014/064632 mailed Dec. 22, 2014.

Pang et al., "Frequency stabilized coherent Brillouin random fiber laser; theory and experiments", Optics Express, vol. 21, No. 22, pp. 27155-27168 (Nov. 2013).

Pang et al., "Observation of narrow linewidth spikes in the coherent Brillouin random fiber laser", Optics Express, vol. 38, No. 11, pp. 1866-1868 (Jun. 2013).

Sugavanam et al., "Narrow-band generation in random distributed feedback fiber laser", Optics Express, vol. 21, No. 14, pp. 16466-16472 (Jul. 2013).

Zhu et al., "Tunable multi-wavelength fiber laser based on random Rayleigh back-scattering", IEEE Photonics Technology Letters, vol. 25, No. 16, pp. 1559-1561 (Aug. 2013).

* cited by examiner

FREQUENCY STABILIZED COHERENT BRILLOUIN RANDOM FIBER LASER

CROSS-REFERENCE TO RELATED APPLICATIONS

This application claims benefit of priority to U.S. Provisional Patent Application No. 61/880,646, filed Sep. 20, 2013 which is incorporated by reference in its entirety.

BACKGROUND

1. Field of the Invention

The present invention relates to random fiber lasers. (RFLs).

2. Related Art

Despite its unique characteristics and lasing mechanisms, the field of random fiber lasers (RFLs), which is based on multiple optical scattering in a disordered gain medium, remains young with few realized applications. This is largely due to the lack of lasing directionality which creates difficulty in achieving a stable, high-quality laser in bulk materials.

SUMMARY

According one broad aspect, the present invention provides an apparatus comprising: a pump laser, a stimulated Brillouin scattering (SBS) gain fiber for producing stimulated Brillouin Stokes light, a Rayleigh scattering (RS) feedback fiber, a Fabry-Perot interferometer (FPI), wherein the apparatus produces a random laser output from the stimulated Brillouin Stokes light, wherein in the SBS and RS form a coherent Brillouin RFL configuration, wherein the Fabry-Perot interferometer (FPI) is optically connected to the coherent Brillouin RFL configuration, and wherein the Fabry-Perot interferometer (FPI) is configured to frequency stabilize the random laser output by optically interacting with the coherent Brillouin RFL configuration.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE PREFERRED EMBODIMENTS

Definitions

Figure 1:
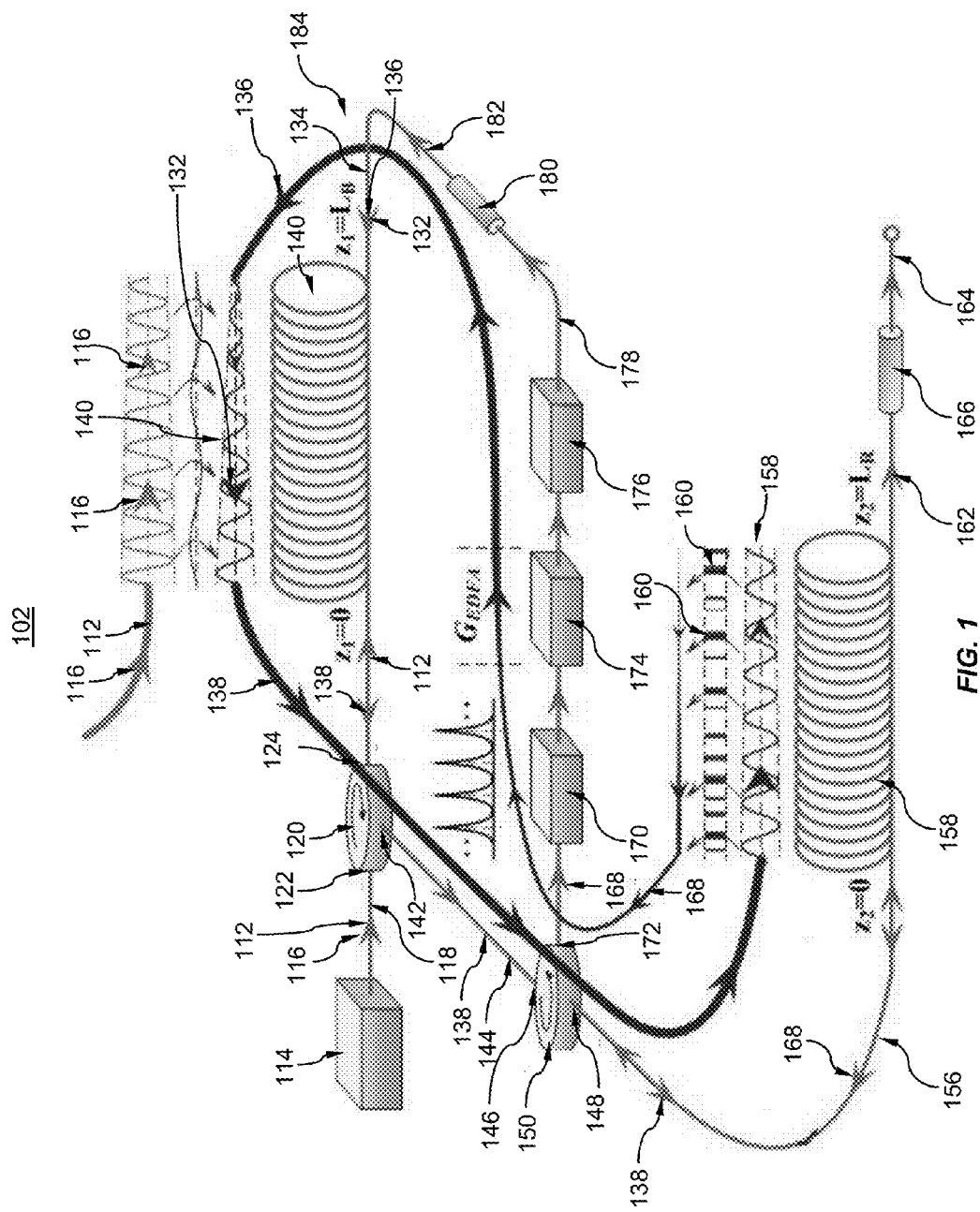
FIG. 1 is a schematic illustration of the operation principle of a coherent frequency-stabilized Brillouin random fiber laser (RFL), according to one embodiment of the present invention.

Where the definition of terms departs from the commonly used meaning of the term, applicant intends to utilize the definitions provided below, unless specifically indicated.

For purposes of the present invention, it should be noted that the singular forms, "a," "an" and "the," include reference to the plural unless the context as herein presented clearly indicates otherwise.

For purposes of the present invention, directional terms such as "top," "bottom," "upper," "lower," "above," "below," "left," "right," "horizontal," "vertical," "up," "down," etc., are used merely for convenience in describing the various embodiments of the present invention. The embodiments of the present invention may be oriented in various ways. For example, the diagrams, apparatuses, etc., shown in the drawing figures may be flipped over, rotated by 90° in any direction, reversed, etc.

For purposes of the present invention, a value or property is "based" on a particular value, property, the satisfaction of a condition or other factor if that value is derived by performing a mathematical calculation or logical operation using that value, property or other factor.

For purposes of the present invention, the term "backscattering" refers to the reflection of waves, particles, or signals back to the direction from which they came. It is a diffuse reflection due to scattering, as opposed to specular reflection like a mirror.

For purposes of the present invention, the term "beat signal" refers to an interference optical signal resulting from combining or mixing of two light signals with different optical frequencies.

For purposes of the present invention, the term "coherence" refers to an ideal property of waves that enables stationary (i.e., temporally and spatially uniform) interference.

For purposes of the present invention, the term "feedback fiber" refers to an optical fiber that functions as a feedback medium.

For purposes of the present invention, the term "gain fiber" refers to an optical fiber that functions as a gain medium.

For purposes of the present invention, the term "heterodyne" refers to a radio signal processing technique invented in which new frequencies are created by combining or mixing two frequencies. Heterodyning is useful for frequency shifting signals into a new frequency range, and is also involved in the processes of modulation and demodulation. The two frequencies are combined in a nonlinear signal-processing device such as a vacuum tube, transistor, or diode, usually called a mixer. In the most common application, two signals at frequencies $f_1$ and $f_2$ are mixed, creating two new signals, one at the sum $f_1+f_2$ of the two frequencies, and the other at the difference $f_1-f_2$. These new frequencies are called heterodynes. Typically only one of the new frequencies is desired, and the other signal is filtered out of the output of the mixer. Heterodynes are related to the phenomenon of "beats" in acoustics.

For purposes of the present invention, the term "linewidth" refers to the width of a spectral line, such as in the electromagnetic emission spectrum of an atom, or the frequency spectrum of an acoustic or electronic system. For example, the emission of an atom usually has a very thin spectral linewidth, as only transitions between discrete energy levels are allowed, leading to emission of photons with a certain energy.

For purposes of the present invention, the term "pump laser" refers to a device that transfers energy from an external source into the gain medium of a laser. The energy is absorbed in the medium, producing excited states in its atoms. When the number of particles in one excited state exceeds the number of particles in the ground state or a less-excited state, population inversion is achieved. In this condition, the mechanism of stimulated emission can take place and the medium can act as a laser or an optical amplifier. The pump power must be higher than the lasing threshold of the laser.

For purposes of the present invention, the term "random laser (RL)" refers to a laser that uses a highly disordered gain medium. A random laser uses no optical cavity but the remaining principles of operation remain the same as for a conventional laser. Random laser action has been observed in many different media, including semiconductor powder, nanostructured and non-nanostructured thin films, laser dyes, ceramics and many more.

For purposes of the present invention, the terms "random fiber laser (RFL) refers to a random laser in which the active gain medium is an optical fiber doped with rare-earth elements such as erbium, ytterbium, neodymium, dysprosium, praseodymium, and thulium. They are related to doped fiber amplifiers, which provide light amplification without lasing.

For purposes of the present invention, the term "Rayleigh scattering (RS) feedback fiber" refers to an optical fiber that carries a feedback signal generated through Rayleigh backscattering of an optical signal.

For purposes of the present invention, the term "scattering" refers to a physical process involving the interaction of light and atoms of a gain medium resulting in emission of new photons in a wide range of directions.

For purposes of the present invention, the term "spontaneous Brillouin Stokes light" refers to light backscattered from thermally induced fluctuations in the density of the carrier or gain medium and down-shifted in frequency.

For purposes of the present invention, the term "stimulated Brillouin scattering" (SBS)" refers to a non-linear effect in an optical fiber in which above a particular threshold, nearly all of the light emitted by a transmitter through the optical fiber is reflected back towards the optical transmitter. Stimulated Brillouin scatter is caused by inelastic scattering of light from externally induced (typically through a light pump) fluctuations in the density of a carrier or a gain medium.

For purposes of the present invention, the term "stimulated Brillouin scattering" (SBS) gain fiber" refers to a pump light driven fiber in which the primary light amplification mechanism is Stimulated Brillouin scattering.

For purposes of the present invention, the term "stimulated Brillouin Stokes light" refers to frequency downshifted light scattered from externally induced fluctuations in the density of a carrier, such as a fiber, in the reverse direction of propagation along the carrier.

For purposes of the present invention, the term "Stokes light" refers to backward scattered light downshifted in frequency.

For purposes of the present invention, the term "threshold power" refers to a power reached by spontaneous Brillouin Stokes light that causes the spontaneous Brillouin Stokes to exit the SBS gain fiber. The "threshold power" may be chosen by the user of an apparatus.

DESCRIPTION

Since Ambartsumyan, Basov and Letokhov proposed the concept of using multiple scattering in gain medium to generate coherent laser-like emission in 1966 [1 and 2], random lasers (RLs) continue to attract interest due to their unique lasing mechanism and potential applications [3, 4, 5 and 6]. The multiple-scattering centers in the RL increase the dwell time of photons in its gain medium, and when the dwell time exceeds the mean generation time of photons, a chain-like photon emission similar to the neutron generation in an atomic bomb is triggered [3]. Over the past decade, different types of RLs have been demonstrated in various bulk materials including crystal powder material [7], laser dye with nanoparticles [8], rare-earth powders [9], semiconductor powder [10], polymer films with silver nanoparticles [11] and even dye-treated human tissues [12]. Based on the feedback mechanisms, RLs can be divided into two categories: RLs with incoherent feedback and RLs with coherent feedback [3]. In RLs with incoherent feedback (also called incoherent RLs), multiple-scattering in gain medium only returns a portion of energy or intensity of light, and the lifetime of emission photons is extended by the stimulated amplification process [4]. In coherent RLs, higher scattering density results in higher possibility of light recurrence [5], which means after multiple scattering, light returns to its original position. The spatial resonance lying among the inter-scattering centers provides the field or amplitude feedback of light, and constructive interference between the scattered light supports coherent lasing spikes at certain resonant frequencies.

Due to the lack of lasing directionality, RLs in bulk materials generally need high scattering density and high-power pulse pump to achieve lasing, and their lasing qualities are also limited [7, 8, 9, 11, 12, 13]. In order to improve the random lasing directionality, several types of random fiber lasers (RFLs) were demonstrated recently [13, 14, 15, 16, 17, 18, 19 and 20], and both incoherent [13, 14 and 15] and coherent [16, 17, 18, 19 and 20] random emissions were observed using optical fiber. Matos et al. used a section of hollow-core photonic crystal fiber, with laser dye material with nanoparticles filled into the hollow core as the gain medium with multiple scattering [13]. A Raman RFL based on Raman gain and Rayleigh scattering feedback was reported in an open fiber cavity with a high lasing efficiency of ~15% [14 and 15]. Er-doped fiber was also used as gain medium to construct coherent RFLs, while randomly distributed Bragg gratings were fabricated to provide random feedback [16 and 17]. In Hu et al. [18], a coherent random laser in a liquid core optical fiber with nanoparticles was reported in the extremely weak scattering regime.

The observation of narrow linewidth lasing spikes in high-quality coherent Brillouin RFLs was recently reported [19 and 20], in which stimulated Brillouin scattering (SBS) in optical fiber was used as the gain mechanism, while distributed Rayleigh scattering (RS) provided random feedback. Due to the weak spontaneous Brillouin scattering in optical fiber and efficient Rayleigh feedback configuration [20], a high-quality resonance of the Stokes light was achieved by using a milliwatt continuous-wave pump source. Coherent lasing spikes with linewidth as narrow as ~10 Hz were observed on the top of the Brillouin gain spectrum. However, high frequency instabilities of this coherent Brillouin RFL including frequency jitters and multi-mode emissions were also observed, and they were mainly induced by: (1) the gain spectrum due to the fiber non-uniformity and (2) the sensitivity of the open laser cavity to external perturbations [20].

In one embodiment of the present invention, a high-finesse Fabry-Perot interferometer (FPI) is introduced into a coherent Brillouin RFL configuration to thereby produce a frequency stabilized random laser.

In one embodiment of the present invention, two coherent Brillouin RFLs with the same coherence properties are generated simultaneously from two gain fibers. This produces a frequency laser by using an FPI which selects one resonant frequency from coherent random feedback modes.

A coherent Brillouin RFL apparatus 102 according to one embodiment of the present invention, is shown in FIG. 1. In Brillouin RFL apparatus 102, when pump light (E 112 is emitted from pump laser 114 in a direction 116 in SBS gain fiber 118 through optical circulator 120, entering optical circulator 120 at port 122 and exiting at port 124. Spontaneous Brillouin Stokes light 132 in gain fiber 134 is initiated from thermal noise [21]. Spontaneous Brillouin Stokes light 132 propagates in a direction 136 that is opposite to direction 116 and has a frequency downshift of ~10.9 GHz with respect to pump light 112 [21 and 22]. Spontaneous Brillouin Stokes light 132 has weak power at room temperature and its coherent time is determined by the phonons lifetime of the fiber material with a value of ~10 ns [22]. As spontaneous Brillouin Stokes light 132 propagates along SBS gain fiber 134 with length of $L_B$, Spontaneous Brillouin Stokes light ($E_S$) 132 is amplified into stimulated Brillouin Stokes light 138 through a nonlinear electrostriction process in region 140, and simultaneously the coherent time of Stokes light ($E_S$) is extended by the stimulated amplification process [23]. Stimulated Brillouin Stokes light 138 out of SBS gain fiber 134 is then sent by optical circulator 120 out of port 142 into an interconnecting fiber 144, then into port 146, out of port 148 of optical circulator 150 and into RS fiber 156. In RS fiber 156, stimulated Brillouin Stokes light 138 works as the pump light of Rayleigh backscattered Stokes light ($E_{RP}$) 158 due to scattering centers 160 of RS fiber 156. The length of RS fiber 156 is $L_R$, and remaining Stokes light 162 out of RS fiber 156 at $z_2=L_R$ works as random laser output 164 after passing through an optical isolator 166. Rayleigh backscattered Stokes light ($E_R$) 168 accumulates in amplitude along RS fiber 156 and then Rayleigh backscattered Stokes light ($E_R$) 168 is sent to an FPI 170 through port 172 of optical circulator 150. FPI 170 works as the frequency selection component for Rayleigh backscattered Stokes light ($E_R$) 168, and the free spectral range of FPI 170 is ~21 MHz to ensure one transmission peak within the ~30 MHz Brillouin gain spectrum. At the transmission peak, Rayleigh backscattered Stokes light ($E_R$) 168 obtains the minimum cavity loss. Er-doped fiber amplifier (EDFA) 174 is used to compensate the optical loss induced by FPI 170, and optical filter 176 with bandwidth of 0.1 nm is used to eliminate amplified spontaneous emission (ASE) noise of EDFA 174. Stokes light 178 out of the optical filter 176 passes through optical isolator 180 and is then sent back to initiation end 184 of Brillouin RFL apparatus 102 and together with newly generated spontaneous Stokes light ($E_R$) 182 works as the seed of a new SBS amplification process.

Figure 2:
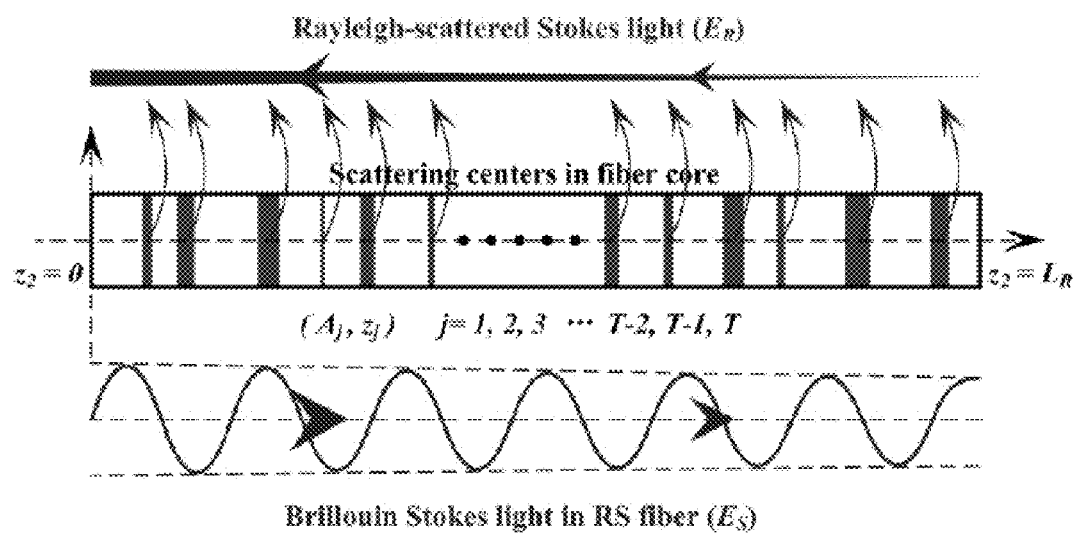
FIG. 2 is an illustration of the interaction between the pump and the stokes wave inside the optical gain fiber.

The modeling and simulations of Rayleigh random feedback are illustrated in FIG. 2. As shown in FIG. 2, the distributed Rayleigh scattering in RS fiber is induced by the non-uniformity of the fiber material which can be considered as frozen scattering centers which are randomly distributed along the RS fiber [14, 19, 20, 24]. Those scattering centers are fully deterministic in time, but their amplitudes and locations are randomly distributed. In this one-dimension random fiber laser, the Stokes light from SBS gain fiber is backscattered by those scattering centers and the backscattered light wave have the same frequency as the Stokes light. The backscattered Stokes light at the input end of RS fiber ($E_R|z_2=0$) is the summation of all the scattered light waves from different scattering centers. In simulations, we assume that the total number of scattering centers in RS fiber is T. For each scattering center j (j ranges from 1 to T), its backscattering amplitude ($A_j$) is a Gaussian random value with a zero mean and a standard deviation related to the Rayleigh scattering coefficient of the RS fiber, while the position of each scattering center ($z_j$) can be considered as uniformly distributed over the whole RS fiber length. When the optical loss and polarization effects are neglected, the summation of backscattered light waves in RS fiber can be written as Equation I, where $n_2$ is the effective refractive index of the fundamental mode in RS fiber, c is the speed of light in vacuum and f is the frequency of the Stokes light.

$$\vec{E}_R = \sum_{i=1}^{T} \vec{E}_S A_j \exp\left(-i\frac{4\pi n_2 f z_j}{c}\right) = R\vec{E}_S \quad \text{(Equation I)}$$

Figure 3:
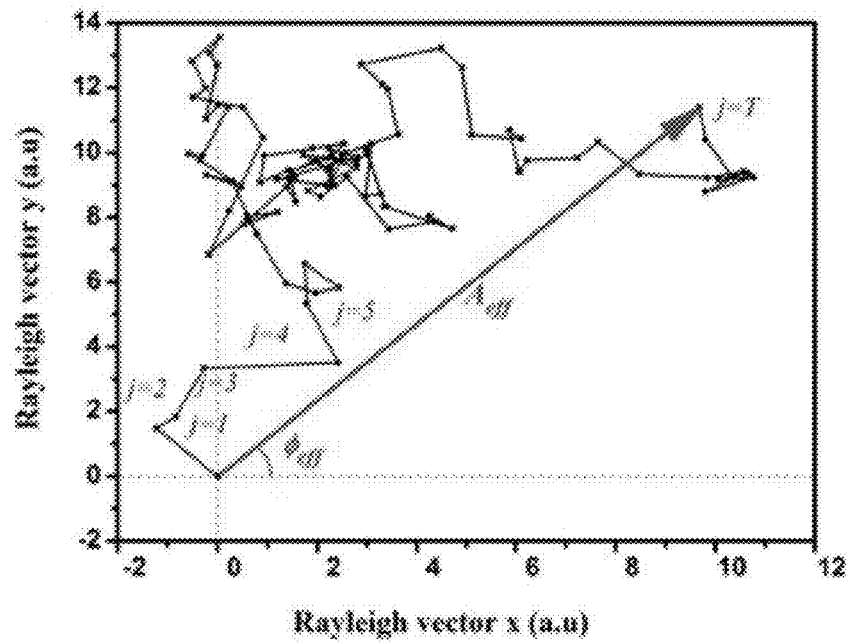
FIG. 3 is a graph showing simulation results of the coherent feedback in the random fiber laser wherein simulated effective Rayleigh factor of the RS fiber is the summation of scattering vectors from different scattering centers.

As shown in FIG. 3, in a system of polar coordinates, the backscattered light wave (at $z_2=0$) from each scattering center can be considered as an effective scattering vector with amplitude of $A_j$) and relative phase of $\phi_j=4\pi n_2 fz_j/c$. Thus the summation of those vectors corresponds to an effective Rayleigh factor (R) with effective amplitude ($A_{eff}$) and phase ($\phi_{eff}$), which is shown as the red line in FIG. 3. The Stokes light after a round trip in this random laser cavity ($E_s'|z_2=0$) can be written as Equation II, where L is the traveling length of the Stokes light outside the RS fiber and $n_1$ is the effective refractive index in SMF28 fiber.

$$\vec{E}_s'|_{z_2=0} = R\vec{E}_s|_{z_3=0} \cdot \exp.(-i2\pi f n_1 L/c) \quad \text{(Equation II)}$$

As shown in Equations I and II, the overall amplitude and phase of $E_s'|z_2=0$ are determined by the frequency of the Stokes light, distribution of the scattering centers in RS fiber, and traveling length of the Stokes light in the open laser cavity. The constructive interference between $E_s'$ and $E_s$ in this open laser cavity happens at the resonant frequencies ($f_{res}$), where phase delay between $E_s|z_2=0$ and $E_s|z_2=0$ is an integral multiple of $2\pi$.

Figure 4:
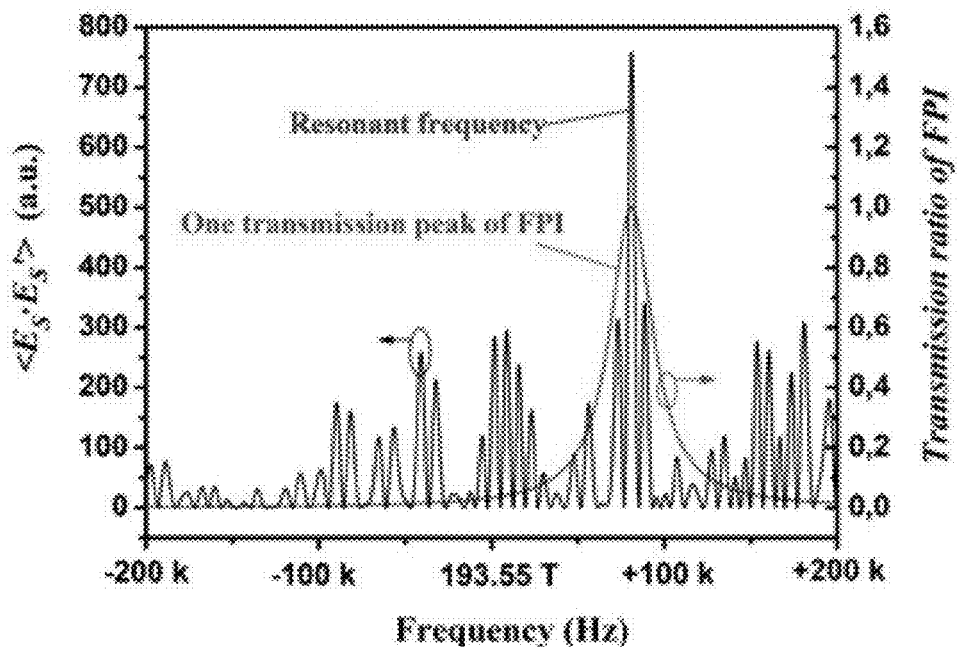
FIG. 4 is a graph showing simulation results of the coherent feedback in the random fiber laser wherein simulated $<E_S \cdot E_S'>$ and one transmission peak of FPI as the function of Stokes light frequency.

In simulations, a group of 100 scattering centers was randomly generated along the RS fiber length, and the vectors $E_s|z_2=0$ and $E_s'|z_2=0$ and were simulated as the function of frequency of the Stokes light. The parameters used in the simulation are summarized below in Table 1. The simulated vector product of $<E_s \cdot E_s'>$ is plotted in FIG. 4, when the frequency span is 400 kHz and the central frequency was selected to be 193.55 THz which corresponds to wavelength of 1550 nm. As shown in FIG. 4, several maximum values of $<E_s \cdot E_s'>$ are observed at the resonant frequencies, where the constructive interference between $E_s$ and $E_s'$ can support coherent random lasing spikes [20]. It can be seen in FIG. 4 that the product values for different resonant frequencies are different, which is induced by the multiple scattering in RS fiber. Different from the conventional laser with fixed cavity length, the feedback of this coherent random fiber laser results from the summation of backscattered waves from multiple scattering centers, and the random distribution of those scattering centers results in uneven amplitudes of the feedback maxima.

TABLE 1

Fiber parameters used in simulations

| SBS gain fiber | | RS fiber | |
| --- | --- | --- | --- |
| Fiber type | SMF28 | Fiber type | Non-uniform fiber |
| $L_B$ (km) | 25, 10, 2 | $L_R$ (km) | 5.4 |
| $n_1$ | 1.46 | $N_2$ | 1.46 |
| $a_B$ (dB/km) | 0.19 | $a_R$ (dB/km) | 0.45 |
| $g_B$ (m$^{-1}$W$^{-1}$) | 0.21 | r (dB/km) | −34 |
| $\mu_{spon}$ (m$^{-1}$) | 7.57e−10 | | |

As demonstrated in Pang et al. [20], due to non-uniformity of the gain fiber, the Brillouin gain spectrum is inhomogeneously broadened [25], and within several MHz range the Brillouin gain factor is relatively uniform. Thus in the Brillouin RFL without FPI [20], frequency jitters and multi-spikes emissions were observed on the top of the random lasing spectrum, which result in the frequency instability of the coherent random laser (similar to mode-hopping in conventional lasers) [26]. As shown in FIG. 4, the FPI used in the setup has a narrow bandwidth of ~30 kHz, which selects one resonant frequency within its bandwidth. Thus random lasing frequency is locked to that transmission peak of the FPI.

The power evolutions of the pump light ($P_P$), Stokes light ($P_S$) in SBS gain fiber, as well as Rayleigh pump light ($P_{RP}$) and Rayleigh backscattered Stokes light ($P_R$) in RS fiber are simulated. In SBS gain fiber, the equations for Pp and $P_S$ can be written as Equation III, where $\alpha_B$ is the linear loss coefficient and $g_B$ is the Brillouin gain factor in SBS gain fiber. $\mu_{spon}$ is the scattering coefficient per unit length related to thermal-induced density fluctuation of the fiber material [22].

$$\begin{cases} \frac{\partial P_P}{\partial z_1} = -\alpha_B P_P - g_B P_P P_S \\ -\frac{\partial P_S}{\partial z_1} = -\alpha_B P_S + g_B P_P P_S + \mu_{spon} P_P \end{cases} \quad \text{(Equation III)}$$

In the RS fiber, the equations for power evolutions of $P_{RP}$ and $P_R$ can be written as Equation IV, where $\alpha_R$ and r are the linear loss coefficient and Rayleigh backscattering coefficient of the RS fiber, respectively [19, 24].

$$\begin{cases} \frac{\partial P_{RP}}{\partial z_2} = -\alpha_R P_{RP} + r P_R \\ -\frac{\partial P_R}{\partial z_2} = \alpha_R P_R + r P_{RP} \end{cases} \quad \text{(Equation IV)}$$

The boundary conditions for Equations III and IV can be considered as the power continuities among Stokes light in the random laser cavity, which can be written as Equation V.

$$\begin{cases} P_S(z_1 = 0) = P_{RP}(z_2 = 0) \\ P_S(z_1 = L_B) = P_R(z_2 = 0) \end{cases} \quad \text{(Equation V)}$$

Figure 7:
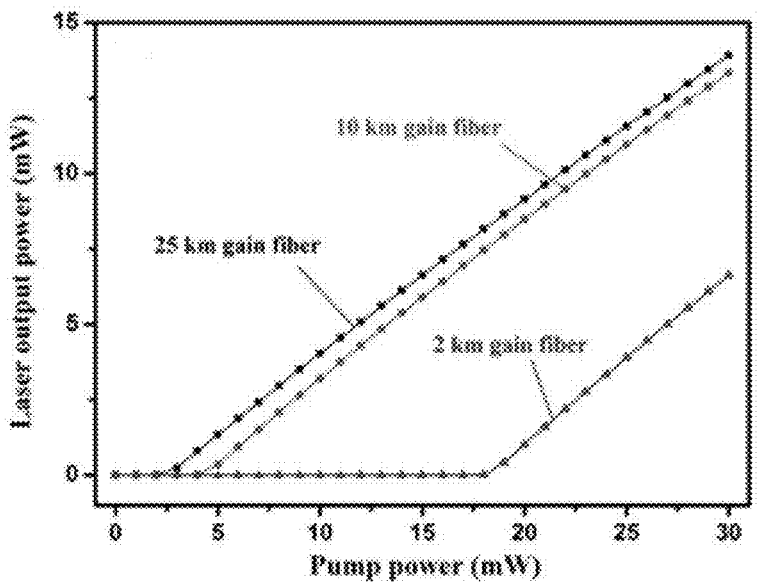
FIG. 7 is a graph showing simulation results of the Brillouin RFL wherein simulated laser output powers is the function pump powers for three different gain fiber lengths.

Using Equations III, IV and V as well as fiber parameters shown in Table 1, the output power ($P_{RP}|z_2=L_R$) of this Brillouin RFL is simulated as the function of pump power ($P_P|z_1=0$), when the length of SBS gain fiber is selected as 25 km, 10 km and 2 km respectively. The simulated results are plotted in FIG. 7. It is shown that those Brillouin RFLs show theoretical lasing thresholds of 3 mW, 5 mW and 17 mW respectively. In theory, the random lasing threshold is defined by the condition that the single-pass Brillouin gain compensates the loss of the Stokes light in a roundtrip within the random laser cavity. When pump power is higher than the lasing threshold, the accumulated backscattered Stokes light in RS fiber exceeds the spontaneous Brillouin Stokes light initiated from thermal noise and dominates the SBS process. Under this condition, the SBS process in gain fiber transforms from an SBS generator to an SBS amplifier [19, 22], and the Stokes light oscillates in the random laser open-cavity.

Figure 5:
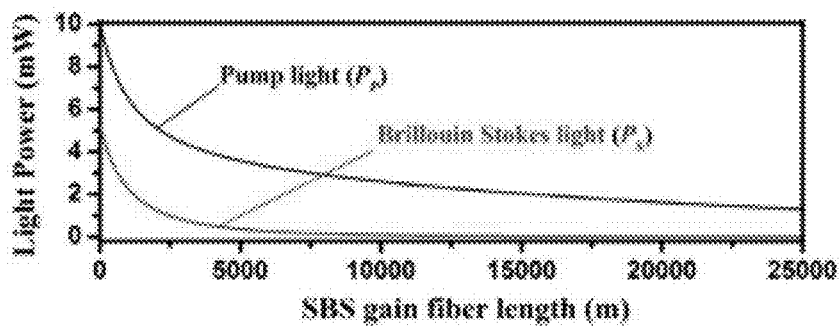
FIG. 5 is a graph showing simulation results of the Brillouin RFL, specifically pump and Brillouin Stokes light in SBS gain fiber.
Figure 6:
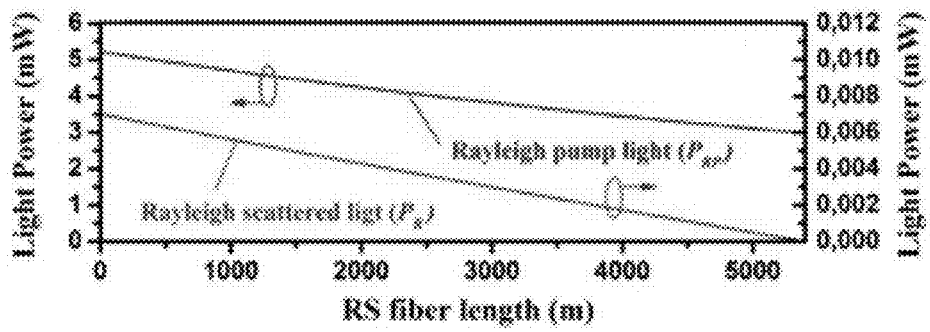
FIG. 6 is a graph showing simulation results of the Brillouin RFL, specifically Rayleigh pump and backscattered light in RS fiber.

The power distribution of $P_P$ and $P_S$ along the SBS gain fiber, and $P_{RP}$ and $P_R$ along the RS fiber were also simulated respectively, when SBS gain fiber length was selected as 25 km and the pump power was set at 10 mW (higher than the lasing threshold). As shown in FIG. 5, $P_S$ was amplified by the pump light when traveling backward in the SBS gain fiber, while $P_P$ decreased due to pump depletion as propagating forward. As shown in FIG. 6, $P_{RP}$ decreased along the RS fiber due to fiber loss while $P_R$ accumulated when traveling backward and reached its maximum at $z_2=0$.

As shown in FIG. 6, the high Rayleigh coefficient of non-uniform fiber provided an efficient random feedback, and more than 0.1% of Stokes light was backscattered. The lasing quality (Q) of this random laser can be defined as the ratio of the feedback Stokes light to the spontaneous Stokes light at the initiation end of the gain fiber, which can be written as $Q=P_R|z_2=0/P_{spon}|z_1=L_B$. For the 25 km gain fiber, when the pump power was 10 mW, Q can be calculated to be as high as $1.94\times10^3$, which is due to this efficient random feedback scheme and the weak spontaneous Brillouin Stokes light in optical fiber. The high lasing quality can extend largely the effective traveling length of the Stokes light in this random laser open-cavity, and the linewidth of its coherent random emission is narrowed by the high-quality light oscillation.

Having described the various embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

EXAMPLES

Example 1

Lasing Threshold and Efficiency Measurements

The FPI used in experiments described below had a free spectral range (FSR) of ~21 MHz and a narrow bandwidth of ~30 kHz. The emission frequency of the coherent Brillouin RFL was locked to one peak of the FPI transmission spectrum, and thus the frequency jitters of the random lasing were decreased to tens kHz comparing with MHz of unlocked condition [20], and the multi-wavelength emission were also suppressed significantly. A theoretical model of this coherent Brillouin RFL was constructed to demonstrate its lasing mechanism as well as the function of narrow-bandwidth FPI to its frequency stabilization. The power evolutions of pump, Brillouin Stokes and Rayleigh scattered Stokes light in both Brillouin gain and Rayleigh feedback fiber were simulated, and the random lasing thresholds and efficiencies were also predicted under different gain fiber lengths.

Three coherent Brillouin RFL apparatuses with SBS gain fiber lengths of 2 km, 10 km and 25 km were built, while the Rayleigh feedback fiber was a section of 5.4 km non-uniform single-mode fiber. Their lasing thresholds and efficiencies were directly measured by a power meter, when their lasing spectra were measured by a heterodyne method. The frequency noise spectrum of the RFL with 25 km gain fiber was measured by a 3-by-3 fiber interferometer, and the results were compared with that of a commercial 3.5 kHz-linewidth fiber laser.

Figure 8:
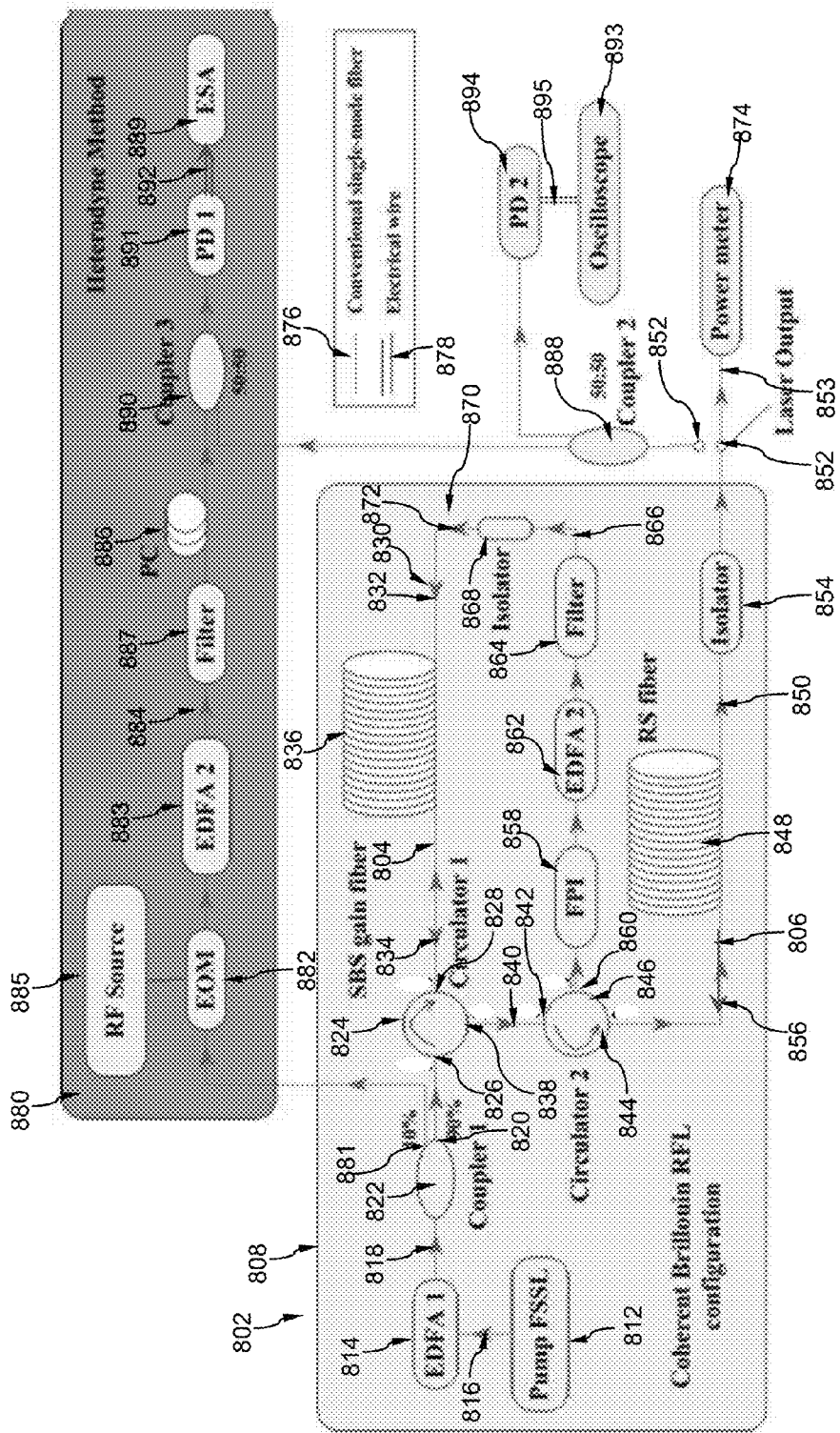
FIG. 8 is a schematic illustration of an experimental set up of a coherent Brillouin RFL configuration and heterodyne method according to one embodiment of the present invention.

FIG. 8 shows a Brillouin RFL apparatus 802 according to one embodiment of the present invention that represents each of the three Brillouin RFL apparatuses which differ only in the length of their respective gain fibers. A SBS gain fiber 804 and an RS fiber 806 put into an aluminous sound proof box 808 to isolate Brillouin RFL apparatus 802 from environmental perturbations. As shown in FIG. 8, pump laser 812 (a commercial frequency stabilized semiconductor laser FSSL, 500 kHz linewidth) and an Er-doped fiber amplifier (EDFA) 814 are used to provide a continuous-wave pump light 816 for the Brillouin RFL apparatus 802.

In Brillouin RFL apparatus 802, pump light 816 is emitted from pump laser 812 in a direction 818 in SBS gain fiber 804 through EDFA 814 and a 90% port 820 of optical coupler 822. After leaving optical coupler 822, pump light 816 enters an optical circulator 824, entering circulator 824 at port 826 and exiting at port 828. Spontaneous Brillouin Stokes light ($E_S$) 830 in SBS gain fiber 804 is initiated from thermal noise [21]. Spontaneous Brillouin Stokes light 830 propagates in a direction 832 that is opposite to direction 818 and has a frequency downshift of ~10.9 GHz with respect to pump light 816 [21 and 22]. Spontaneous Brillouin Stokes light ($E_S$) 830 has weak power at room temperature and its coherent time is determined by the phonons lifetime of the fiber material with a value of ~10 ns [22]. As propagating along SBS gain fiber 804 with length of $L_B$, spontaneous Brillouin Stokes light ($E_S$) 830 is amplified into stimulated Brillouin Stokes light 834 through a nonlinearly electrostriction process in region 836, and simultaneously the coherent time of spontaneous Brillouin Stokes light ($E_S$) 830 is extended by the stimulated amplification process [23]. Stimulated Brillouin Stokes light 834 out of SBS gain fiber 804 is then sent by optical circulator 824 out of port 838 into an interconnecting 840, then into port 842, out of port 844 of optical circulator 846 in into RS fiber 806. In RS fiber 806, stimulated Brillouin Stokes light 834 works as pump light of Rayleigh backscattering 848. The length of RS fiber 806 is $L_R$ (5.4 km), and remaining Stokes light 850 coming out of RS fiber 806 at $z_2=L_R$ works as random laser output 852 after passing through an optical isolator 854 and is transmitted through SBS gain fiber 853. Rayleigh backscattered Stokes light ($E_R$) 856 accumulates in amplitude along RS fiber 806 and then backscattered Stokes light ($E_R$) 856 is sent to an FPI 858 through port 844 and port 860 of optical circulator 846. FPI 858 works as the frequency selection component for Rayleigh backscattered Stokes light ($E_R$) 856, and the free spectral range of FPI 858 is ~21 MHz to ensure one transmission peak within the ~30 MHz Brillouin gain spectrum. At the transmission peak, Rayleigh backscattered Stokes light ($E_R$) 856 obtains the minimum cavity loss. Er-doped fiber amplifier (EDFA) 862 is used to compensate the optical loss induced by FPI 858, and optical filter 864 with bandwidth of 0.1 nm is used to eliminate amplified spontaneous emission (ASE) noise of EDFA 862. Stokes light 866 out of the optical filter 864 passes through optical isolator 868 and is then sent back to an initiation end 870 of SBS gain fiber 804 and together with newly generated spontaneous Stokes light ($E_R$) 872 works as the seed of a new SBS amplification process.

RS fiber 806 is fixed as a section of 5.4 km non-uniform single-mode fiber, while three sections of SMF28 fiber with lengths of 25 km, 10 km and 2 km were used, respectively, as SBS gain fiber 804.

Figure 9:
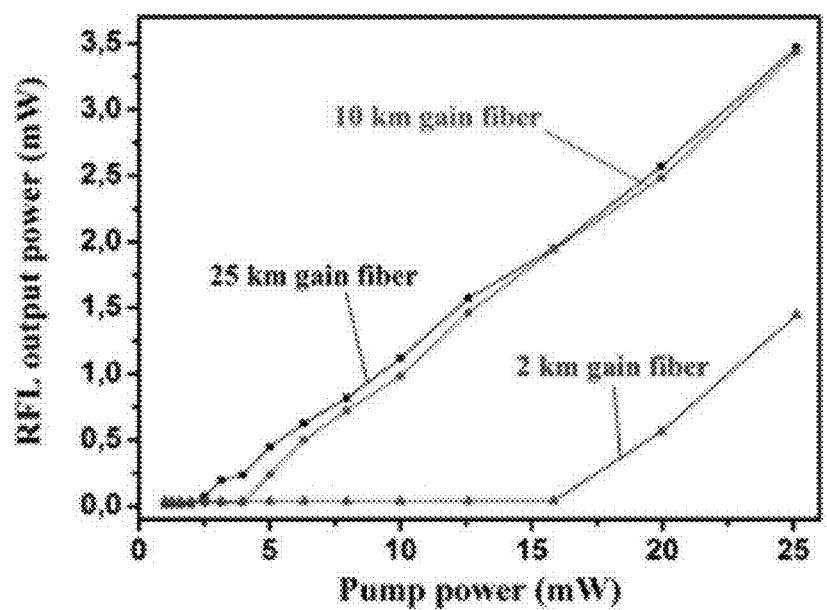
FIG. 9 is a graph illustrating the performance of the coherent random lasing wherein measured output power is the function of pump power for three different gain fiber lengths.

SBS gain fiber 853 that carries random laser output 852 is connected to a power meter 874. In the fabrication process of the non-uniform fiber, a continuous refractive index changing in fiber core was induced by modulating the Ge-doped concentration of its core area [27], which results in both higher fiber loss (0.45 dB/km) and larger Rayleigh coefficient (~34 dB/km) than conventional SMF28 fiber. The laser output powers were measured by using a power meter. For three different gain fiber lengths, laser output powers as the function of pump power were plotted in FIG. 9. It can be seen that the measured lasing thresholds for those three random lasers are ~2.5 mW, ~5 mW and ~20 mW respectively, which agree well with the theoretical predictions shown in FIG. 7. After their lasing thresholds, the random lasers show lasing efficiencies of 13.8%, 13.6% and 5.75% respectively.

In FIG. 8, single mode fibers are shown with single lines 876 and the electrical wires is shown with a double-line 878.

A heterodyne apparatus 880 was used to measure the lasing spectrum of the random laser with the 25 km SBS gain fiber at various pump powers (see FIG. 8). In heterodyne apparatus 880, a portion of pump light 816 from a 10% port 881 of optical coupler 822 was downshifted in frequency by an electro-optic modulator (EOM) 882 and then amplified by an EDFA 883 as the reference light 884. A radio frequency (RF) source 885 (HP 83640A) was used to control the modulation frequency of EOM 882, while tunable optical fiber 886 (5 GHz bandwidth) was used to eliminate the ASE noise from EDFA 883 after reference light 884 passed through an optical filter 887. The beat signal between reference light 884 and random laser output 852, which has passed through a coupler 888, was measured by electrical spectrum analyzer ESA 889 (Agilent E4446A), after passing through coupler 890 and a photo detector 891. The beat signal was transmitted to ESA 889 through electrical wire 892. The output power trace of the coherent Brillouin RFL in time domain was also measured by oscilloscope 893 after the output power trace passed through coupler 888 and a photo detector 894. The signal from photo detector 894 is transmitted to oscilloscope 893 through electrical wire 895. The resolution of this heterodyne method is limited by the linewidth of the reference light 884, which has the same value as that of pump laser 812 (500 kHz). Thus, this heterodyne method enables only the coherent random lasing spectrum to be measured, but not the precise linewidth of the coherent random lasing output.

Figure 10:
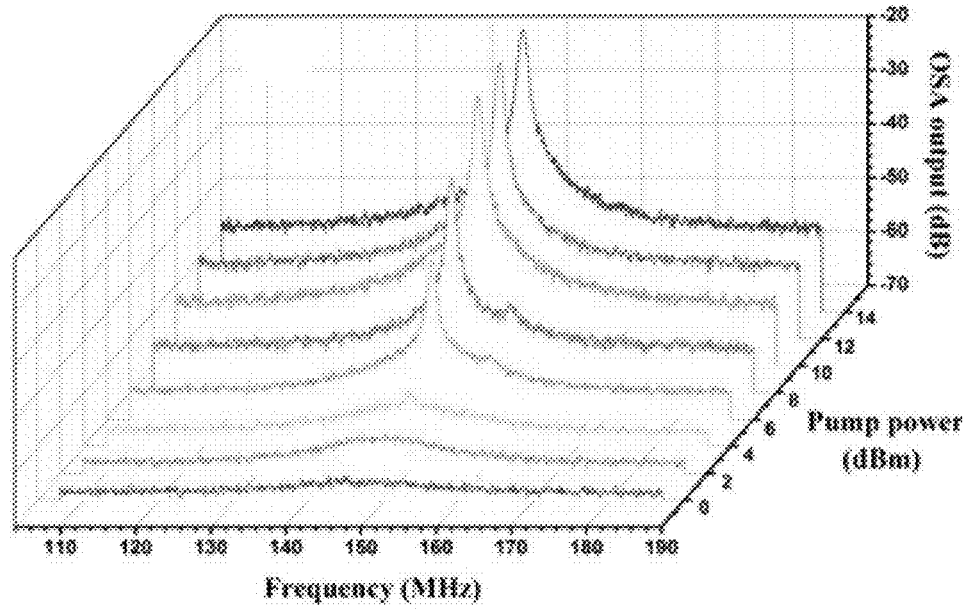
FIG. 10 is a graph illustrating the performance of the coherent random lasing, specifically measured spectra at different pump powers, when the RF was set to 10.7 GHz.

FIG. 10 gave the measured lasing spectra of this coherent Brillouin RFL at different pump powers. Measured output powers as the function of pump powers for the three different gain fiber lengths are shown as a graph in FIG. 9. It can be seen when the pump power was higher than the lasing threshold, a sharp lasing emission peak with narrow linewidth appeared on top of the Brillouin gain spectrum, which agrees well with the theoretical predictions of the present invention.

Example 2

Laser Relative Intensity Noise Measurement

Figure 11:
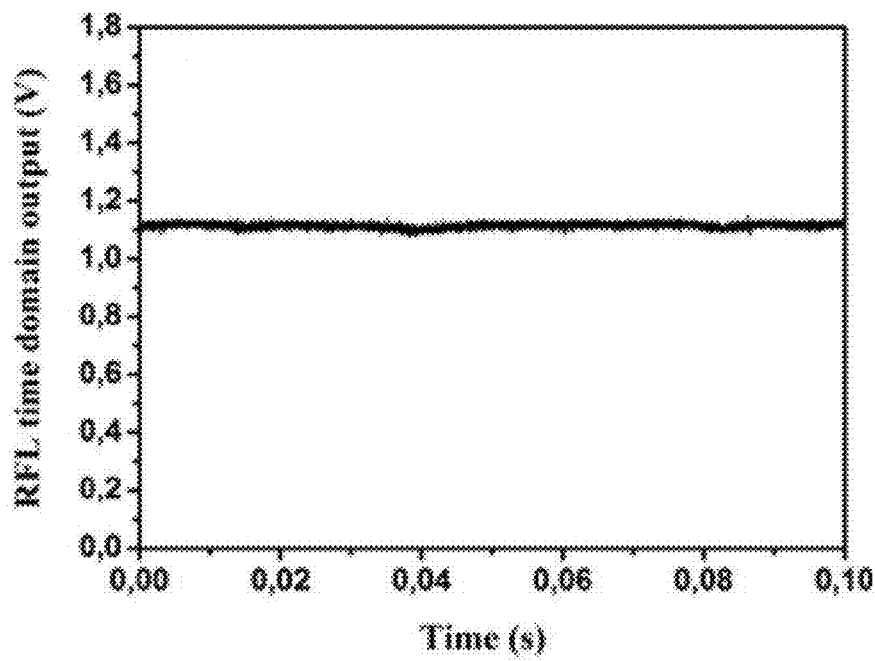
FIG. 11 is a graph illustrating the measured time-domain trace of the coherent Brillouin RFL.
Figure 12:
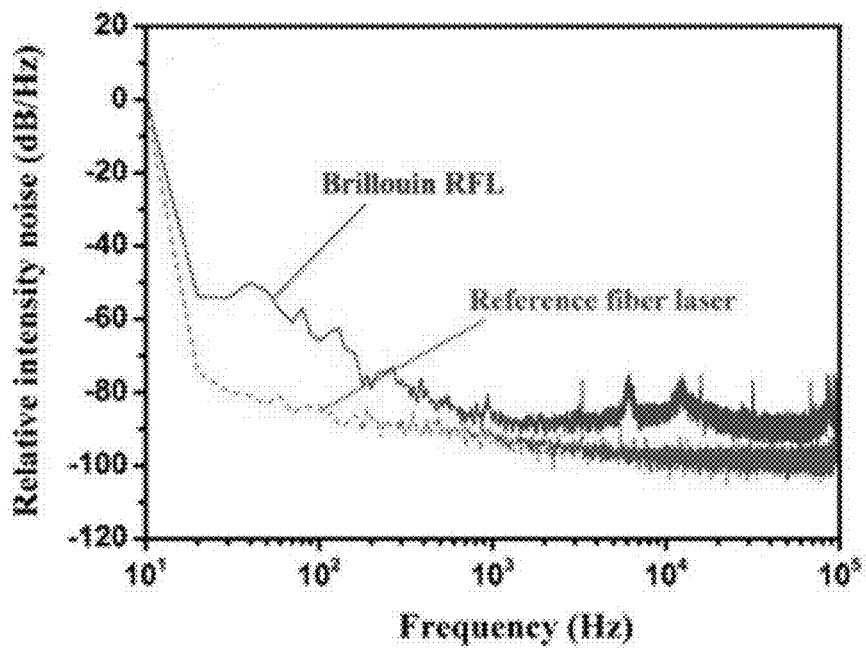
FIG. 12 is a graph of measured relative intensity noise spectra of the coherent Brillouin RFL and reference 3.5 kHz-linewidth fiber laser.

In the experiments, the output power trace of this coherent Brillouin RFL in time domain was also measured, when the length of SBS gain fiber was selected as 25 km and the pump power was 20 mW. As shown in FIG. 8, photodetector 894 (Thorlabs PDB130C) with bandwidth from DC to 350 MHz was used to measure random laser output 852 directly. The experimental result was recorded with oscilloscope 893 (Agilent DSO81204B), and the result was plotted in FIG. 11. It can be seen that the output intensity of the coherent Brillouin RFL shows good stability, and the straight time-domain line in FIG. 11 confirmed the single-wavelength operation of this random fiber laser. The power spectrum of this time-domain trace gave the relative intensity noise (RIN) spectrum of this coherent Brillouin RFL, which was plotted as solid curve labeled Brillouin RFL in FIG. 12. The noise power spectrum of detector was measured to be −140 dB/Hz, which is 30 dB lower than the RIN of the RFL. Thus the relative intensity noise we measured does include the detector noise; however it is small enough to be neglected. For comparison, the RIN spectrum of the commercial fiber laser (3.5 kHz linewidth) (See Reference 29) was also measured with the same setup and plotted as dash curve labeled Reference fiber laser in FIG. 12. As shown in FIG. 12, the RIN spectrum of the coherent Brillouin RFL had the similar level with that of the pump fiber laser, but shows some low-frequency noise which was mainly resulted from external perturbations.

Example 3

Laser Frequency Noise Measurement

Figure 13:
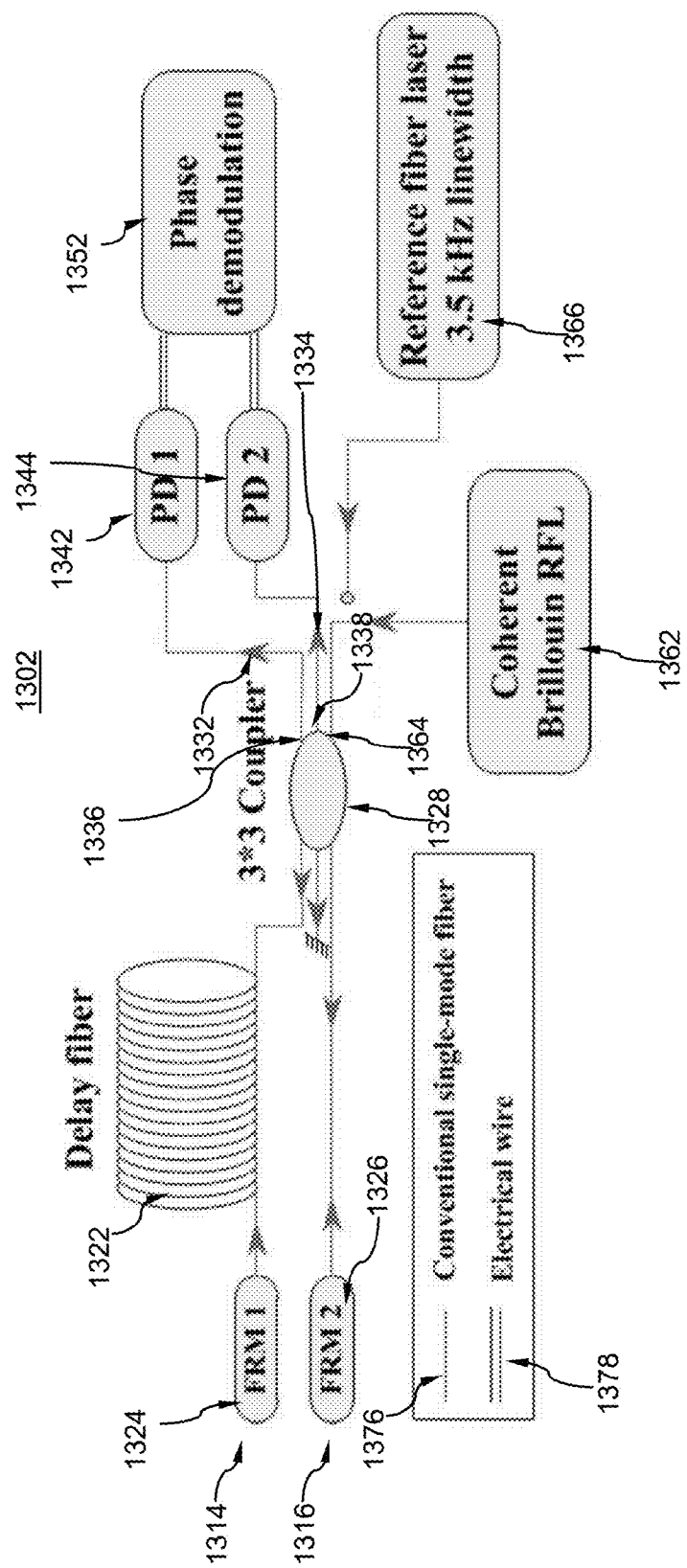
FIG. 13 is a schematic illustration of an experimental setup for the frequency noise measurement of lasers.

In laboratory, the frequency noise spectrum of this coherent Brillouin RFL with gain fiber length of 25 km was measured by using a 3-by-3 unbalanced Michelson fiber interferometer and a digital phase demodulation scheme [30]. The experimental setup for the frequency noise measurement is shown in FIG. 13. FIG. 13 shows a Brillouin RFL apparatus 1302 having two arms, i.e., arms 1314 and 1316. In Brillouin RFL apparatus 1302, a section of conventional SMF28 fiber was included into one arm, arm 1314, as a delay fiber 1322, while two Faraday rotation mirrors (FRM), FRM 1324 and 1326 were used to eliminate the polarization fluctuation in the fiber interferometer, i.e., 3-by-3 coupler 1328. Two interferometric signals, i.e., signals 1332 and 1334, from ports 1336 and 1338, respectively of 3-by-3 coupler 1328 were detected by two photodetectors, i.e., photodetectors 1342 and 1344 (DC-350 Hz bandwidth) and then sent into a digital demodulation scheme 1352 to get the phase information of the fiber interferometer.

Figure 14:
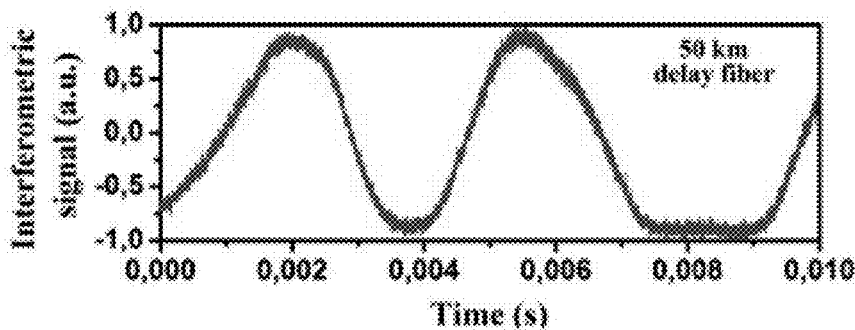
FIG. 14 is a graph showing normalized interferometric signal from port 2 of the 3-by-3 Michelson interferometer for the coherent Brillouin RFL.
Figure 15:
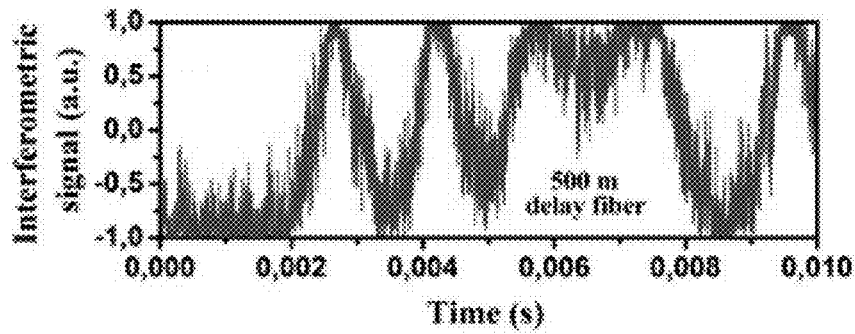
FIG. 15 is a graph showing normalized interferometric signal from port 2 of the 3-by-3 Michelson interferometer for a 500 m reference delay fiber laser.

For a coherent Brillouin RFL 1362, the interferometric signal from port 1338 of 3-by-3 coupler 1328 was recorded and plotted in FIG. 14, when the delay fiber used in the setup was 50 km (corresponding to 100 km delay line in Michelson interferometer). For comparison, the reference 3.5 kHz-linewidth fiber laser was also used to illuminate the same 3-by-3 interferometer, when 500 m conventional SMF28 fiber was used as the delay fiber (corresponding to 1 km delay line). The interferometric signal for a reference fiber laser 1366 was recorded and plotted in FIG. 15. For the interferometric signal of Brillouin RFL shown in FIG. 14, clear interferometric fringe was observed at 100 km delay line, this demonstrated a long coherent length of this RFL.

In FIG. 13, single mode fibers are shown with single lines 1376 and the electrical wires is shown with a double-line 1378.

Figure 16:
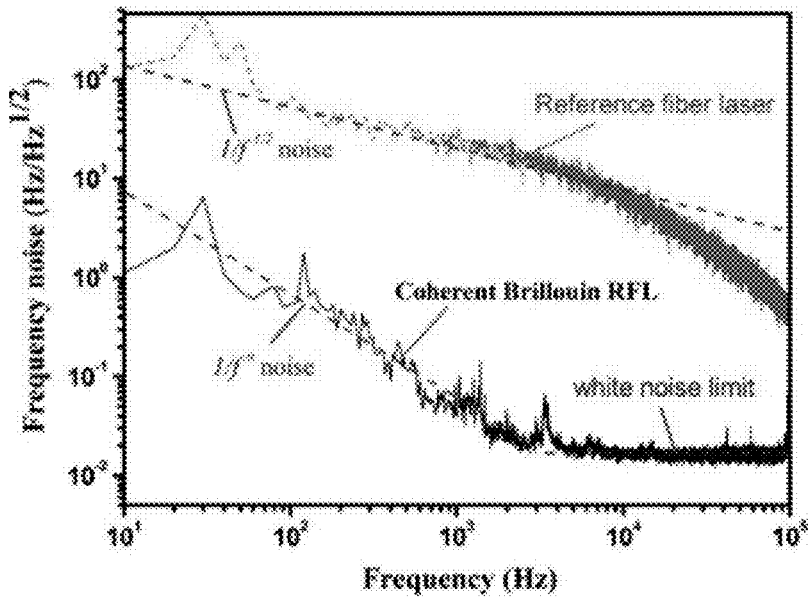
FIG. 16 is a graph showing frequency noise spectra of the Brillouin RFL and reference fiber laser.

Using a digital phase demodulation scheme [30], the frequency noise spectra of both the coherent Brillouin RFL and reference fiber laser were computed from their interferometric signals respectively, and the results were plotted in FIG. 16. As expected, the frequency noise spectrum of the reference fiber laser exhibits a $1/f^{1/2}$ dependence at low frequency and a logarithmic roll-off at higher frequency range, which is induced by the thermal-induced fluctuation of its laser cavity length [30, 31, 32]. From the frequency noise spectrum of the coherent Brillouin RFL FIG. 16, the thermal-induced $1/f^{1/2}$ noise is largely suppressed due to its long cavity length and randomly distributed feedback scheme. A quick drop at frequency range below ~3 kHz is the flick noise [33] induced by its slow frequency shift, while at frequency range higher than ~3 kHz, its frequency noise spectrum shows the white noise limit, which is mainly induced by fluctuation of laser output intensity. As shown in FIG. 16, the measured frequency noise value of this coherent Brillouin RFL at 10 kHz is as low as ~20 mHz/Hz$^{1/2}$, which is about 20 dB lower than that of the reference fiber laser at 10 kHz.

Example 4

Laser Linewidth and Frequency Stability Measurements

Using a laser apparatus (Brillouin RFL) of the present invention in order to measure the coherence performance and frequency stability of this Brillouin RFL, two coherent Brillouin RFLs with same coherence properties were generated simultaneously from two gain fibers. The beat signal of those two RFLs was recorded and used to illustrate their coherence performance, linewidth and frequency stability. This apparatus was a frequency laser that was achieved by using an FPI, which selects one resonant frequency from coherent random feedback modes.

In order to verify the coherence performance of this coherent Brillouin RFL apparatus, two Brillouin RFLs with the same linewidth but a lasing frequency difference of ~42 MHz were constructed. Both Brillouin RFLs have the SBS gain fiber length of 25 km. The beat signal of the two random laser outputs was measured to characterize the coherence performance and frequency stability of this coherent Brillouin RFL apparatus [20, 34]. The laser apparatus used in the experiments is shown in FIG. 17.

Figure 17:
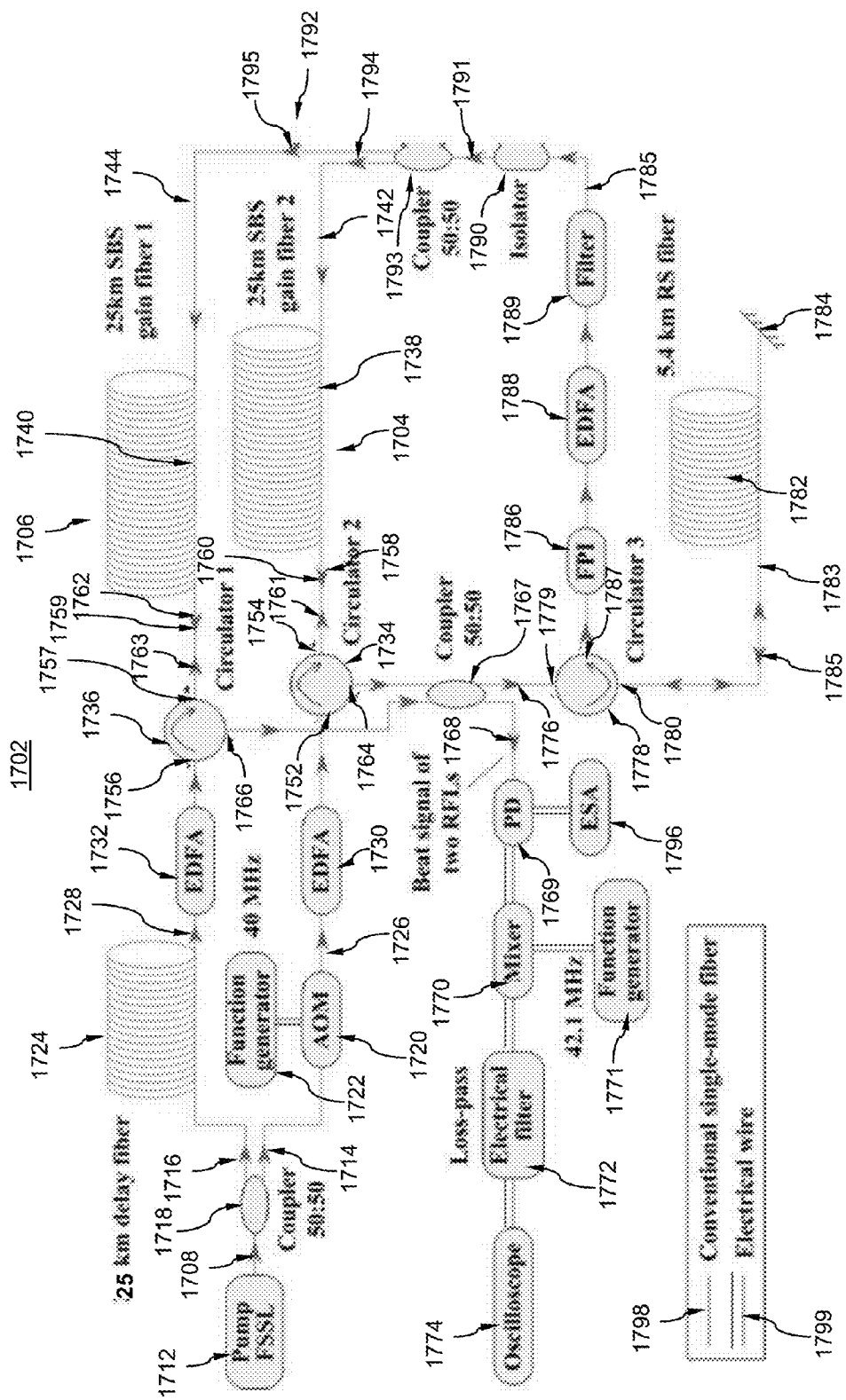
FIG. 17 is a schematic illustration of an experimental setup generation of two coherent Brillouin RFLs with lasing frequency different of ~42.1 MHz and measurement of the beat signal between those two RFLs.

Brillouin RFL apparatus 1702 shown in FIG. 17 includes two coherent Brillouin RFLs, i.e., RFLs 1704 and 1706. Light 1708 output by pump FSSL 1712 is divided into two light beams, i.e. light beams 1714 and 1716 after light 1708 passes through an optical coupler 1718. The optical frequency of light beam 1714 is downshifted by an acousto-optic modulator 1720 (AOM), whose modulation frequency is controlled by function generator 1722 with a fixed frequency of 40 MHz. Light beam 1716 travels through a section of 25 km delay fiber 1724 (longer than the coherent length of the 500 kHz linewidth pump FSSL) to make light beam 1716 incoherent with light beam 1726. Light beams 1726 and 1728 with frequency difference of 40 MHz are amplified by two EDFAs, i.e., EDFAs 1730 and 1732, and then pass through optical circulators 1734 and 1736, into two sections of 25 km SBS gain fiber, i.e., SBS gain fibers 1738 and 1740. Spontaneous Brillouin Stokes light 1742 and 1744 are generated in SBS gain fibers 1738 and 1740, respectively, due to Brillouin scattering. Light beam 1726 enters optical circulator 1734 at port 1752 and exits optical circulator 1734 at port 1754. Light beam 1728 enters optical circulator 1736 at port 1756 and exits optical circulator 1736 at port 1757.

Spontaneous Brillouin Stokes light 1742 is amplified into stimulated Brillouin Stokes light 1758 through a nonlinear electrostriction process in SBS gain fiber 1738. Spontaneous Brillouin Stokes light 1744 is amplified into stimulated Brillouin Stokes light 1759 through a nonlinear electrostriction process in SBS gain fiber 1740.

When the power of stimulated Brillouin Stokes light 1758 and the power of stimulated Brillouin Stokes light 1759 are both 10 mW, i.e. have reached a threshold power. Stimulated Brillouin Stokes light 1758 is sent out on SBS gain fiber 1738 in a direction 1760 opposite direction 1761 that light beam 1714 enters SBS gain fiber 1738. Stimulated Brillouin Stokes light 1759 is sent out on SBS gain fiber 1740 in a direction 1762 opposite direction 1763 that light beam 1716 enters SBS gain fiber 1740.

Figure 18:
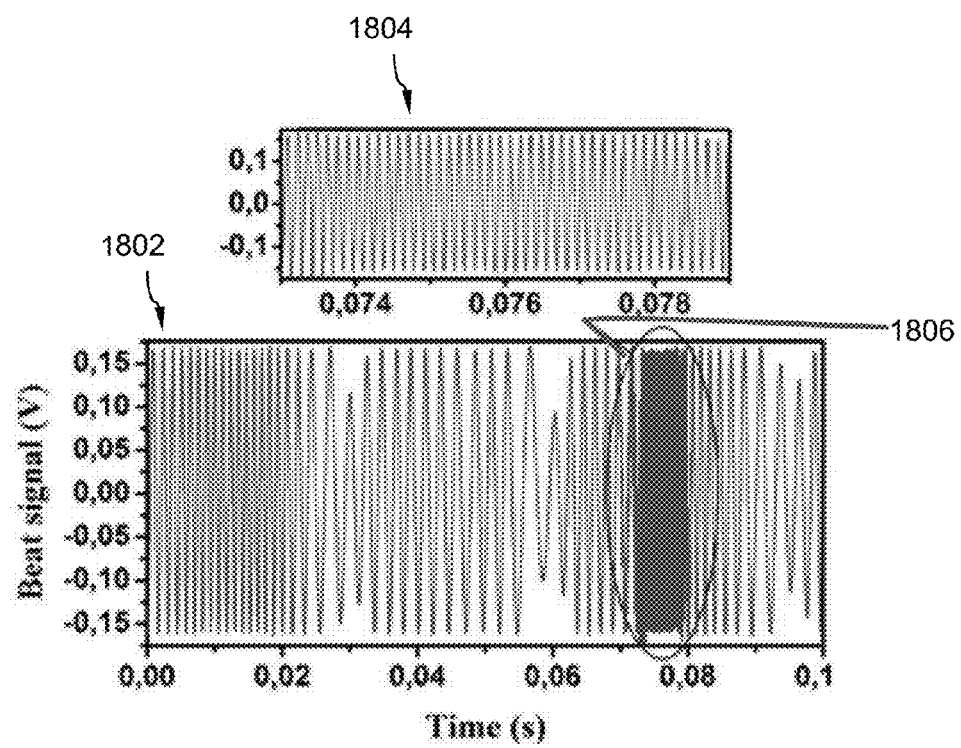
FIG. 18 is an image showing how the beat signal of two RFLs mixed down to low-frequency range with a perfect 42.1 MHz sine function, and recorded by a digital oscilloscope.
Figure 19:
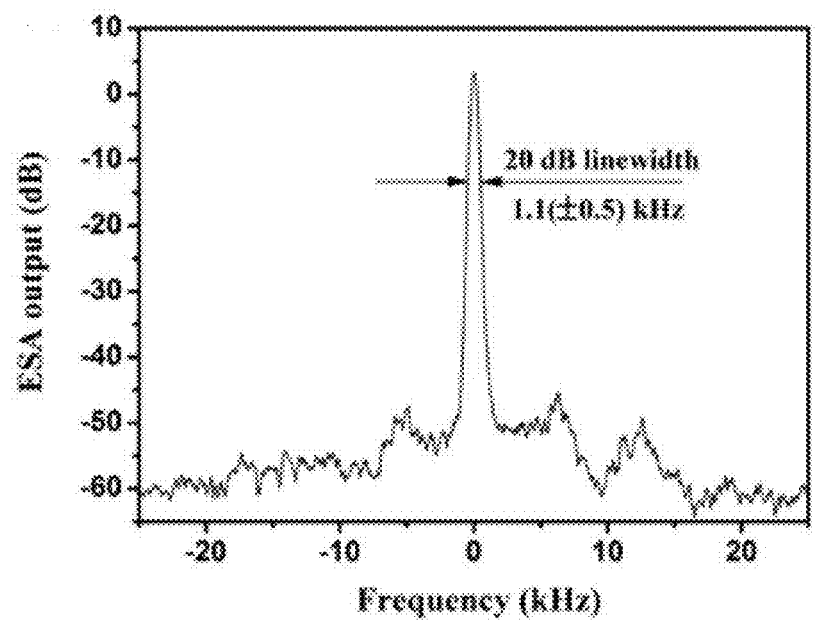
FIG. 19 is an image showing a power spectrum of the beat signal normalized to 42.1 MHz, measured by ESA with a span of 50 kHz and frequency resolution of 0.5 kHz.

Brillouin Stokes light 1758 enters optical circulator 1734 at port 1754 and exits at port 1764. Brillouin Stokes light 1759 enters optical circulator 1736 at port 1757 and exits at port 1766. After passing through optical circulators 1734 and 1736, respectively, stimulated Brillouin Stokes light 1758 and 1759 enter through optical coupler 1767. In optical coupler 1767, stimulated Brillouin Stokes light 1758 and 1759 are combined and a first portion of the combined light exits optical coupler 1767 as beat signal 1768 of RFLs 1704 and 1706. Beat signal 1768 is detected by photodetector 1769 and then mixed in mixer 1770 with a sine signal generated by function generator 1771. The low frequency component of the mixed signal was filtered out by electrical low-pass optical filter 1772 and then recorded by digital oscilloscope 1774 (see also FIGS. 18 and 19).

A second portion of the combined light of stimulated Brillouin Stokes light 1758 and 1759 exits optical coupler 1767 as stimulated Brillouin Stokes light 1776 and enters optical circulator 1778 at port 1779 and exits at port 1780. Stimulated Brillouin Stokes light 1776 works as pump light of RS fiber 1783 that is grounded at ground 1784. Rayleigh backscattered Stokes light 1785 accumulates in amplitude along RS fiber 1783 and then Rayleigh backscattered Stokes light 1785 is sent to an FPI 1786 through port 1780 and port 1787 of optical circulator 1778. FPI 1786 works as the frequency selection component for Rayleigh backscattered Stokes light 1785 and the free spectral range of FPI 1786 is ~21 MHz to ensure one transmission peak within the ~30 MHz Brillouin gain spectrum. At the transmission peak, Rayleigh backscattered Stokes light 1785 obtains the minimum cavity loss. Er-doped fiber amplifier (EDFA) 1788 is used to compensate the optical loss induced by FPI 1786, and optical filter 1789 with a bandwidth of 0.1 nm that is used to eliminate amplified spontaneous emission (ASE) noise of EDFA 1788. Rayleigh backscattered Stokes light 1785 out of optical filter 1789 passes through optical isolator 1790 as output Stokes 1791. Output Stokes light 1792 is sent back to an initiation end 1792 of Brillouin RFL apparatus 1702. Output Stokes light 1792 is split by optical coupler 1793 into light beams 1794 and 1795. Light beams 1794 and 1795 work as the seeds of for a new SBS amplification process.

The linewidth of the beat signal between those two Brillouin RFLs was also measured by using electrical spectrum analyzer (ESA) 1796. The beat spectrum, normalized to 42.1 MHz (two times of the free spectrum range of the FPI), was shown in FIG. 19. In order to increase the measurement accuracy, a 20 dB linewidth of the beat signal was measured to be 1.1(±0.5) kHz, which corresponds to the RFL Lorentzian 3 dB linewidth of 55(±25) Hz. The measured RFL linewidth of ~50 Hz is in good agreements with the coherent time of ~0.01 s shown in FIG. 18.

In FIG. 17, single mode fibers are shown with single lines 1798 and electrical wires are shown with double lines 1799.

When the frequency of the function generator was set to 42.1 MHz, the frequency of beat signal was shifted to low frequency range, where the coherence property of the coherent Brillouin RFL can be observed easily in time domain. As shown in plots 1802 and 1804 of FIG. 18, the measured beat signal between two RFL outputs shows constant phase in a time period of ~0.01 s demonstrating a coherent length as long as ~3×10$^6$ m. Plot 1804 shows circled region 1806 of plot 1802.

Figure 20:
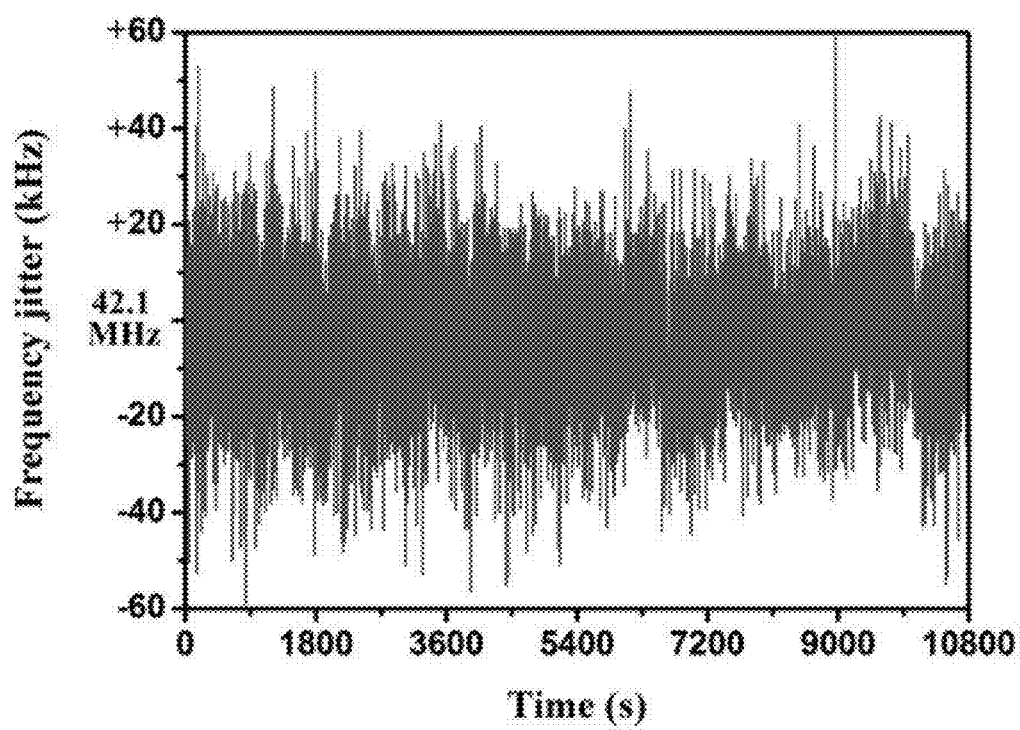
FIG. 20 is an image of measured frequency jitter of the beat signal between two RFLs within 3 hours, when the time step was 0.5 seconds.

In order to characterize the frequency stability of the coherent Brillouin RFL, the frequency jitter of the beat signal between two RFLs were recorded in 3 hours with a time step of 0.5 s. As shown in FIG. 20, in 3 hours the measured frequency jitter was within ~±20 kHz, which shows a two order of magnitude improvement compared with the Brillouin RFL without FPI [20]. The FPI used in this RFL cavity provides a wavelength-dependent selection of the Rayleigh feedback light, and thus the random lasing frequency is locked within the ~30 kHz bandwidth of the FPI transmission peak. By using the measured results shown in FIG. 20, the Allen standard deviation [33, 34] of this coherent Brillouin RFL with FPI can be calculated to be ~2.5×10$^{-11}$ at average time of 100 seconds.

REFERENCES

The following references are referred to above and/or describe technology that may be used with the present invention and contents and disclosures of the following references are incorporated herein by reference:
1. R. V. Ambartsumyan, N. G. Basov, P. G. Kryukov, and V. S. Letokhov, "A laser with a nonresonant feedback," IEEE J. Quantum Electron. 2, 442-446 (1966).
2. V. S. Letokhov, "Stimulated emission of an ensemble of scattering particle with negative absorption," JETP Lett. 5, 212-215 (1967).
3. H. Cao, "Random lasers: development, features and applications," Opt. Photon. News 16, 24-29 (2005).
4. H. Cao, "Lasing in random media," Wave in Random Media, 13, R1-R39 (2003).

5. H. Cao, "Review on latest development in random lasers with coherent feedback," J. Phys. Math. Gen. 38, 10497-10535 (2005).
6. R. C. Polson, M. E. Raikh, and Z. V. Vardeny, "Universal properties of random lasers," IEEE J. Sel. Top. Quantum Electron. 9(1), 120-123 (2003).
7. S. Gottardo, O. Cavalieri, O. Yaroshchuk, and D. S. Wiersma, "Quasi-two-diffusive random laser action," Phys. Rev. Lett. 93, 263901 (2004).
8. N. M. Lawandy, R. M. Balachandran, A. S. L. Gomes, and E. Sauvain, "Laser action in strongly scattering media," Nature 368, 436-438 (1994).
9. H. Cao, Y. G. Zhao, S. T. Ho, E. W. Seelig, Q. H. Wang, and R. P. H. Chang, "Random laser action in semiconductor powder," Phys. Rev. Lett. 82, 2278-2281 (1999).
10. G. R. Williams, S. B. Bayram, S. C. Rand, T. Hinklin, and R. M. Laine, "Laser action in strongly scattering rare-earth-metal-doped dielectric nanophosphors," Phys. Rev. A 65, 013807 (2002).
11. X. Meng, K. Fujita, Y. Zong, S. Murai, and K. Tanaka, "Random lasers with coherent feedback from high transparent polymer films embedded with silver nanoparticles," Appl. Phys. Lett. 92(20), 201112 (2008).
12. R. C. Polson, and Z. V. Vardeny, "Random lasing in human tissues," Appl. Phys. Lett. 85, 1289-1291 (2004).
13. C. J. S. Matos, L. S. Meneze, A. M. Brito-Silva, M. A. M. Gamez, A. S. L. Gomes, and C. B. Araujo, "Random fiber laser," Phys. Rev. Lett. 99, 153903 (2007).
14. S. K. Turitsyn, S. A. Babin, A. E. El-Taher, P. Harper, D. V. Churkin, S. I. Kablukov, J. D. Ania Castanon, V. Karalekas, and E. V. Podivilov, "Random distributed feedback fibre laser," Nat. Photonics 4, 231-235 (2010).
15. A. A. Fotiadi, "An incoherent fibre laser," Nat. Photonics 4, 204-205 (2010).
16. M. Gagne, and R. Kashyap, "Demonstration of a 3 mW threshold Er-doped random fiber laser based on a unique fiber Bragg grating," Opt. Express, 17(21), 19067-19074 (2009).
17. N. P. Puente, E. I. Chaikina, T. A. Leskova, and E. R. Mendez, "Single-mode Er-doped fiber random laser with distributed Bragg grating feedback," Opt. Express 17(2), 395-404 (2009).
18. Z. Hu, Q. Zhang, B. Miao, Q. Fu, G. Zou, Y. Chen, Y. Luo, D. Zhang, P. Wang, H. Ming, and Q. Zhang, "Coherent random fiber laser based on nanoparticles scattering in the extremely weakly scattering regime," Phys. Rev. Lett. 109 (25), 253901 (2012).
19. M. Pang, S. Xie, X. Bao, Da-Peng Zhou, Y. Lu, and L. Chen, "Rayleigh scattering-assisted narrow linewidth Brillouin lasing in cascaded fiber," Opt. Lett. 37(15), 3129-3131 (2012).
20. M. Pang, X. Bao, and L. Chen, "Observation of narrow linewidth spikes in the coherent Brillouin random fiber laser," Opt. Lett. 38(11), 1866-1868 (2013).
21. R. W. Boyd, and K. Rzazewski, "Noise initiation of stimulated Brillouin scattering," Phys. Rev. A 42, 5514-5521 (1990).
22. R. W. Boyd, Nonlinear Optics, (Academic Press, San Diego, 2010).
23. A. Yeniay, J. M. Delavaux, and J. Toulouse, "Spontaneous and stimulated Brillouin scattering gain spectra in optical fibers," IEEE J. Lightwave Technol. 20, 1425-1432 (2002).
24. A. H. Hartog, and M. P. Gold, "On the theory of backscattering in single-mode optical fibers," IEEE J. Lightwave Technol. 2, 76-82 (1984).
25. S. Xie, M. Pang, X. Bao, and L. Chen, "Polarization dependence of Brillouin linewidth and peak frequency due to fiber inhomogeneity in single mode fiber and its impact on distributed fiber Brillouin sensing," Opt. Express, 20(6), 6385-6399 (2012).
26. G. A. Ball, and W. W. Morey, "Continuously tunable single-mode erbium fiber laser," Opt. Lett. 17(6), 420-422 (1992).
27. M. Li, S. Li, and D. A. Nolan, "Nonlinear Fibers for signal processing using optical Kerr effects," IEEE J. Lightwave Technol. 23(11), 3606-3614 (2005).
28. D. Derickson, Fiber Optic Test and Measurement (Prentice-Hall PTR, 1998).
29. C. Spiegelberg, J. Geng, Y. Hu, Y. Kaneda, S. Jiang, and N. Peyghambarian, "Low-noise narrow-linewidth fiber laser at 1550 nm (June 2003)," IEEE J. Lightwave Technol. 22(1), 57-64 (2004).
30. G. A. Cranch, and G. A. Miller, "Fundamental frequency noise properties of extended cavity erbium fiber lasers," Opt. Lett. 36(6), 906-908 (2011).
31. S. Foster, A. Tikhomirov, and M Milnes, "Fundamental thermal noise in distributed feedback fiber lasers," IEEE J. Quantum Electron. 5, 378-384 (2007).
32. S. Foster, G. A. Cranch and A. Tikhomirov, "Experimental evidence for the thermal origin of 1/f frequency noise in erbium-doped fiber lasers," Phys. Rev. A 79, 053802 (2009).
33. D. W. Allan, "Time and frequency (time-domain) characterization, estimation and prediction of precision clocks and oscillators," IEEE Trans. Ultr. Ferr. Contr. 34, 647-654 (1987).
34. T. Kessler, C. Hagemann, C. Grebing, T. Legero, U. Sterr, F. Riehle, M. J. Martin, L. Chen and J. Ye, "A 0-mHz-linewidth laser based on a silicon single-crystal optical cavity," Nat. Photonics 6, 687-692 (2012).

While the present invention has been disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:
1. An apparatus comprising:
   a pump laser,
   a stimulated Brillouin scattering (SBS) gain fiber for producing stimulated Brillouin Stokes light,
   a Rayleigh scattering (RS) feedback fiber,
   a Fabry-Perot interferometer (FPI),
   wherein the apparatus produces a random laser output from the stimulated Brillouin Stokes light,
   wherein in the SBS and RS form a coherent Brillouin RFL configuration,
   wherein the Fabry-Perot interferometer (FPI) is optically connected to the coherent Brillouin RFL configuration, and
   wherein the Fabry-Perot interferometer (FPI) is configured to frequency stabilize the random laser output by optically interacting with the coherent Brillouin RFL configuration.
2. The apparatus of claim 1, wherein the pump laser has a linewidth of 500 kHz.
3. The apparatus of claim 1, wherein the SBS gain fiber has a length of 2 to 25 km.
4. The apparatus of claim 1, wherein the random laser output has a power of 2.5 to 20 mW.

5. The apparatus of claim 1, wherein the pump laser is a frequency stabilized semiconductor laser (FSSL).

6. The apparatus of claim 5, wherein said FSSL has a linewidth of 500 kHz.

* * * * *